United States Patent [19]

Tamura et al.

[11] Patent Number: 4,932,357
[45] Date of Patent: Jun. 12, 1990

[54] VACUUM APPARATUS

[75] Inventors: Naoyuki Tamura; Norio Kanai, both of Kudamatsu, Japan

[73] Assignee: Hitachi, Ltd., Tokyo, Japan

[21] Appl. No.: 181,703

[22] Filed: Apr. 14, 1988

[30] Foreign Application Priority Data

Apr. 17, 1987 [JP] Japan .................. 62-93055

[51] Int. Cl.[5] .................................... C23C 16/52
[52] U.S. Cl. .................... 118/715; 118/719; 118/730; 414/226
[58] Field of Search ............. 118/719, 728, 729, 730, 118/686, 687, 500, 715; 414/217, 225, 226; 148/DIG. 169; 156/610, 612, DIG. 103

[56]  References Cited

U.S. PATENT DOCUMENTS

| 4,584,045 | 4/1986 | Richards | 414/217 |
| 4,770,121 | 9/1988 | Ebata et al. | 414/225 |
| 4,795,299 | 1/1989 | Boys et al. | 414/225 |
| 4,810,473 | 3/1989 | Tamura et al. | 118/730 |

FOREIGN PATENT DOCUMENTS 62-35513  2/1987  Japan .

*Primary Examiner*—Richard Bueker
*Assistant Examiner*—Terry J. Owens
*Attorney, Agent, or Firm*—Antonelli, Terry, Stout & Kraus

[57] ABSTRACT

A vacuum apparatus comprising a substrate setting disc which is arranged in a conveyance chamber and on which substrates are placed, a drive system which drives and rotates the disc, a cam which is fixed to the disc, switching means to switch signal circuits through the cam, calculation means to receive digital signals generated by the switching operations of the switching means, signals from the drive system and signals from respective processing devices so as to execute calculations, a memory which registers calculated results, and a display unit which displays the registered contents on a screen, rotational positions of the disc being loaded so as to control the hysteretic aspects of the individual substrates within the conveyance chamber with the substrates at the respective positions and addresses held in correspondence.

7 Claims, 7 Drawing Sheets

FIG. 9

| ELECTRIC SWITCH \ FEED | 0 | 1 | 2 | 3 | 4 | 5 | 6 | 7 | 8 | 9 |
|---|---|---|---|---|---|---|---|---|---|---|
| 14a | 1 | 0 | 0 | 1 | 1 | 0 | 1 | 0 | 1 | 1 |
| 14b | 1 | 1 | 1 | 0 | 0 | 1 | 1 | 0 | 1 | 0 |
| 14c | 1 | 0 | 1 | 1 | 1 | 0 | 0 | 1 | 1 | 0 |
| 14d | 1 | 0 | 1 | 0 | 1 | 1 | 1 | 0 | 0 | 1 |
| ADDRESS | 0 | 1 | 2 | 3 | 4 | 5 | 6 | 7 | 8 | 9 |

FIG. 10

| ELECTRIC SWITCH \ FEED | 0 | 1 | 2 | 3 | 4 | 5 | 6 | 7 | 8 | 9 |
|---|---|---|---|---|---|---|---|---|---|---|
| 14a | 0 | 1 | 0 | 1 | 0 | 1 | 0 | 1 | 0 | 1 |
| 14b | 0 | 0 | 1 | 1 | 0 | 0 | 1 | 1 | 0 | 0 |
| 14c | 0 | 0 | 0 | 0 | 1 | 1 | 1 | 1 | 0 | 0 |
| 14d | 0 | 0 | 0 | 0 | 0 | 0 | 0 | 0 | 1 | 1 |
| ADDRESS | 0 | 1 | 2 | 3 | 4 | 5 | 6 | 7 | 8 | 9 |

FIG. 14

| SUBSTRATE \ ADDRESS | 0 | 1 | 2 | 3 | 4 | 5 | 6 | 7 |
|---|---|---|---|---|---|---|---|---|
| PRESENCE OR ABSENCE | ● | ● |   | ● |   | ● |   |   |
| PROCESS (1) | ● | ● |   |   |   |   |   |   |
| PROCESS (2) | ● |   |   |   |   |   |   |   |
| PROCESS (3) | ● |   |   |   |   |   |   |   |

MARK ● INDICATES THE PRESENCE OF A SUBSTRATE OR THE END OF A PROCESS.

FIG. 15

| SUBSTRATE \ ADDRESS | 0 | 1 | 2 | 3 | 4 | 5 | 6 | 7 |
|---|---|---|---|---|---|---|---|---|
| PRESENCE OR ABSENCE | ● | ● |   | ● |   | ● |   |   |
| PROCESS (1) | ● | ● |   |   |   |   |   |   |
| PROCESS (2) | ● | ○ |   |   |   |   |   |   |
| PROCESS (3) | ● |   |   |   |   |   |   |   |

MARK ○ INDICATES "UNDER PROCESS".

VACUUM APPARATUS

BACKGROUND OF THE INVENTION

1. Field of the Invention

The present invention relates to a vacuum apparatus, and more particularly to a vacuum apparatus which is well suited for a case where the hysteretic control of a plurality of substrates during the preparation of the substrates having a hysteresis is required.

2. Description of the Prior Art

A prior art apparatus is described in Japanese Patent Application Laid-open No. 35513/1987. It will now be explained. Substrates are introduced through an introducing chamber, and are placed on a substrate setting disc. The setting disc is rotated, and the substrate is shifted into a growth chamber (for processing), in which a crystal is grown on the substrate. Thereafter, the substrate is brought back to the setting disc and is shifted into a delivery chamber. The substrate is taken out of the apparatus through the delivery chamber.

In the molecular-beam epitaxy apparatus of the prior art, controlling the hysteretic aspects of the individual substrates is not considered at all in spite of the fact that the substrates on the substrate setting disc undergo various hysteretic aspects such as the removal of the water content of the substrate, prebaking for surface cleaning, waiting for the crystal growth, the end of the crystal growth, and the end of the surface analysis of the crystal.

SUMMARY OF THE INVENTION

Object of the Invention

An object of the present invention is to provide, in a vacuum apparatus furnished with a substrate setting disc which conveys a plurality of substrates having various hysteretic aspects, a vacuum apparatus capable of controlling the hysteretic aspects of the individual substrates.

STATEMENT OF THE INVENTION

In a vacuum apparatus having an introduction chamber through which a substrate is introduced, a delivery chamber through which the substrate is delivered, a processing chamber in which the substrate is processed, and a preparation chamber in which a plurality of substrates are temporarily stored so as to be distributed into the respective chambers except the introduction chamber, wherein a plurality of kinds of hysteretic aspects develop in the substrates in the course of the processing thereof; the present invention comprises a substrate setting disc which is arranged in said preparation chamber and on which the substrates are placed, a drive system which drives and rotates said disc, a cam which is fixed to said disc, switching means to switch signal circuits through said cam, calculation means to receive digital signals generated by the switching operations of said switching means, signals from said drive system and signals from respective processing devices so as to execute calculations, a memory which registers calculated results, and a display unit which displays the registered contents on a screen.

BRIEF DESCRIPTION OF THE DRAWINGS

FIGS. 1 thru 15 are diagrams for explaining a vacuum apparatus according to the present invention, in which FIG. 1 is a plan view of an embodiment, FIG. 2 is a sectional view taken along line I - I' in FIG. 1, FIG. 3 is a partial sectional view of a drive mechanism, FIG. 4 is a sectional view taken along line II - II' in FIG. 2, FIG. 5 is a sectional view taken along line III - III' in FIG. 2, FIG. 6 is a sectional view taken along line IV - IV' in FIG. 5, FIG. 7 is a sectional view of a detent, FIGS. 9 and 10 are diagrams for explaining address allocations, FIG. 11 is a block diagram of a system, FIG. 12 is a flow chart of a method of managing addresses, FIG. 13 is a diagram for explaining the allocation of memory addresses, and FIGS. 14 and 15 are diagrams each showing a display example on a CRT screen; and FIG. 16 is a general structural view of a molecular-beam epitaxy apparatus to which the present invention is applied, while

DESCRIPTION OF THE PREFERRED EMBODIMENTS

Figure 1:
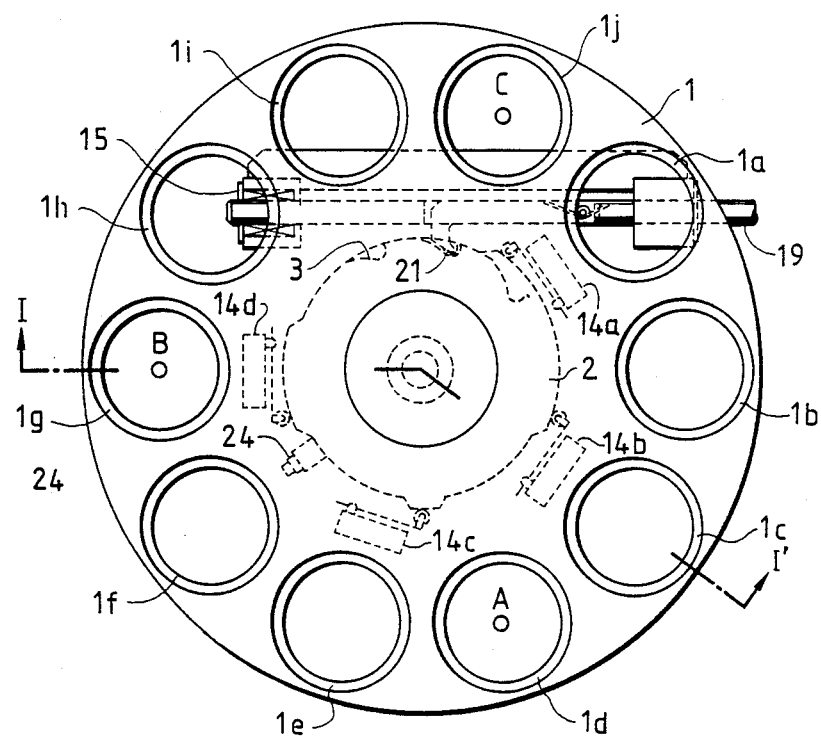
Figure 2:
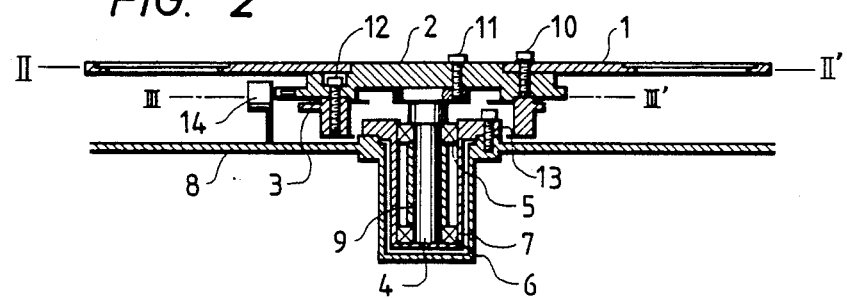
Figure 3:
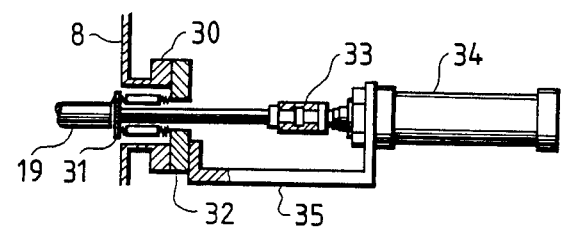

Now, an embodiment of the present invention will be described with reference to the drawings.

Referring to FIGS. 1 thru 7, a substrate setting disc 1 adapted to rotate is secured to a cam 2 by a bolt 10, and the cam 2 is secured by a bolt 11 to a flange which is provided at one end of a spindle 4. On the other hand, a journal box 7 is secured by a bolt 13 to a boss with which a vacuum vessel 8 (defining a preparation chamber) is provided, and ball bearings 5 and 6 are disposed in the journal box 7 so as to engage the spindle 4. In consequence, the substrate setting disc 1 is so supported as to be rotatable relative to the vacuum vessel 8. A spacer 9 is disposed in order to hold the interval of the ball bearings 5 and 6. Recesses 1a–1j are places on which substrates or samples (not shown) are respectively put.

However, the illustration does not necessarily restrict the number of the places for putting the substrates thereon. Letters A, B and C exemplify places where the substrates are transferred. By way of example, the substrate is brought in from an introduction chamber (not shown) in the place A, it is taken into and out of a growth chamber (not shown) in the place B, and it is transferred for delivery into a delivery chamber (not shown) in the place C.

Figure 5:
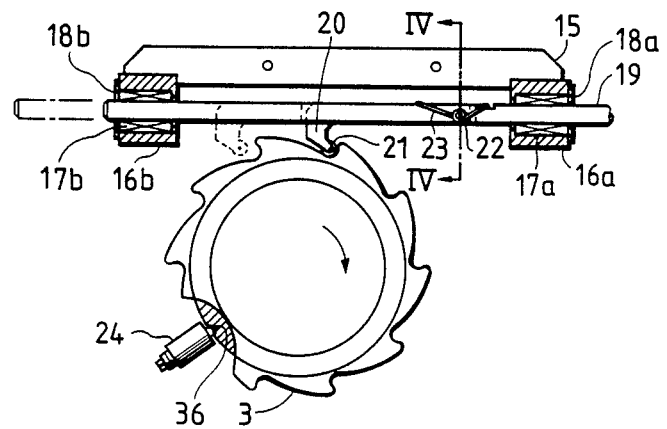
Figure 6:
Figure 7:
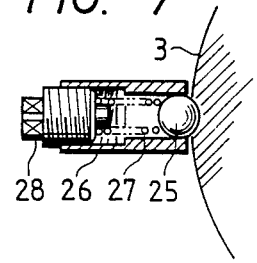
Figure 8A:
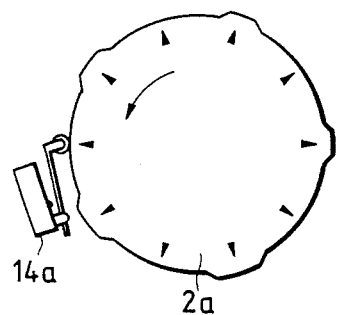
FIGS. 8a–8d are plan views of cams in another embodiment.
Figure 8B:
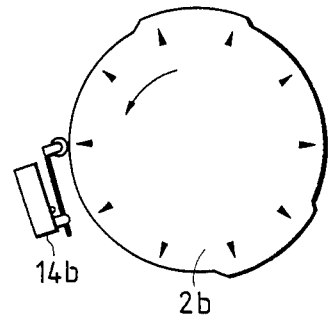
Figure 8C:
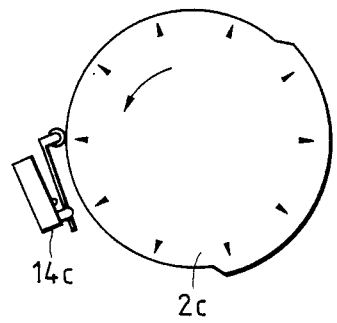
Figure 8D:
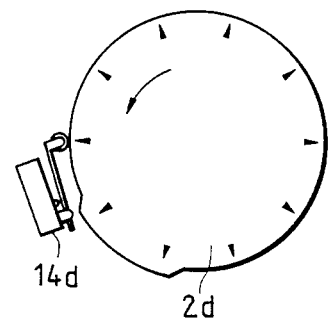

The cam 2 is also secured to a cam 3 by a bolt 12, and an example of the shape of the cam 3 is shown in FIG. 5. The cam 3 engages a cam follower 21, this cam follower 21 is held in rotatable engagement with one end of a lever 20, and the other end of the lever 20 is rotatably connected with a shaft 19 by a pin 22. The movement of the lever 20, however, is regulated by a spring 23 so as to rotate unidirectionally relative to the shaft 19. The essentials for mounting the lever 20 on the shaft 19 are shown in FIG. 6.

The shaft 19 is supported by journal boxes 16a and 16b through linear slide bearings 17a and 17b, and the journal boxes 16a and 16b are carried on the vacuum vessel 8 by a bracket 15 secured thereto. Bearing caps 18a and 18b are mounted lest the linear slide bearings 17a and 17b should come off the journal boxes 16a and 16b, respectively.

The cam 3 is constructed of a portion of a cam profile and a portion of a cylinder. The cylindrical portion is provided with indents 36 corresponding in number to the substrate setting places of the substrate setting disc 1, and a detent 24 is disposed in correspondence with one of the indents.

The detent 24 has a steel ball 25, a spring 27 and an adjusting screw 28 received in a case 26, which is fixed to the ultrahigh vacuum vessel 8.

The shaft 19 is welded to one end of bellows 31 for vacuum sealing, and the other end of the bellows 31 is welded to a flange 32. The flange 32 is held in engagement with a flange 30 with which the vacuum vessel 8 is provided, and vacuum sealing is performed by, e. g., a structure employing a metal gasket.

While penetrating the bellows 31, the shaft 19 is connected with the driving appliance of an air cylinder 34 through a joint 33. The air cylinder 34 is secured to the flange 32 or any other suitable place by a bracket 35.

The cam 2 has a cam profile which includes convex portions in magnitudes necessary for turning "on" and "off" the contacts of electric switches 14a-14d, and it rotates unitarily with the setting disc 1.

The electric switches 14a-14d are fabricated of metal pieces, ceramics, etc., and have a sufficient thermal resistance. In addition, a polyimide resin is employed for the insulation of wiring leads within vacuum, whereby requisites are satisfied for both an emission gas amount and a heat resisting property.

Now, when the setting disc 1 is to be rotated 1 pitch, the air cylinder 34 is stretched, whereby the bellows 31 prolongs. Then, while the cam follower 21 is rolling on the cam surface of the cam 3, the lever 20 rocks about the pin 22 and moves to the position of a two-dot chain line indicated in FIG. 5.

The cam surface is so shaped that a torque which urges the disc 1 to rotate (be enticed) by virtue of the depressing force of the cam follower 21 becomes nearly constant, whereby the cam follower 21 is prevented from rotating the setting disc 1 counterclockwise in impact fashion.

Subsequently, when the air cylinder 34 is contracted, the cam follower 20 meshes with the next concave portion of the cam 3 and rotates the setting disc 1 clockwise. On that occasion, in the detent 24, the spring 27 is compressed, and the steel ball 25 comes off the indent 36 of the cylinderical portion of the cam 3 and slides on the outer periphery of the cylinder. The adjusting screw 28 is used for adjusting the strength with which the steel ball 25 is pressed against the indent 36. When the air cylinder 34 has reverted into the state of FIGS. 3 and 5, the detent 24 fits in the next indent 36a (not shown) and holds its position.

At this time, the air cylinder 34 is adapted to come to the stroke end thereof. Accordingly, there is the same effect as attained when the drive system is positioned by a mechanical stopper, and the positional accuracy of each pitch is very high.

The cam 2 and the electric switches 14a-14d allow specific addresses to be assigned to setting places of the setting disc 1. Now, when all the electric switches are turned ON under the state of FIG. 4 and the disc 1 is rotated one pitch, the cam 2 is simultaneously rotated the same magnitude. Then, the electric switches 14a-14d become 14a = OFF, 14b = ON, 14c = OFF and 14d = OFF. When the disc 1 is further rotated one pitch, the electric switches become 14a = OFF, 14b = ON, 14c = ON and 14d = ON. In this manner, the combination of the ON/OFF states changes successively. The relations between the feed of the setting disc 1 and the states of the electric switches are tabulated as shown in FIG. 9 ("ON" is denoted by "0," and "OFF" by "1"). When each of the electric switches 14a-14d is regarded as one bit, up to 16 kinds of signal combinations are possible.

Figure 4:
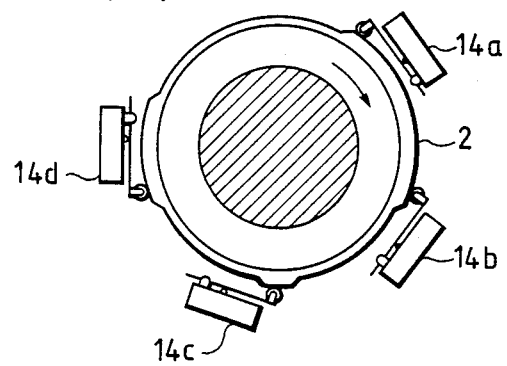

As illustrated in FIGS. 8a-8d, cams 2a, 2b, 2c and 2d and the electric switches 14a-14d, which form respective pairs, can also be disposed in four stages by way of example. The relations between the feed of the setting disc 1 and the electric switches on this occasion are listed in FIG. 10. Arrows in FIGS. 8a-8d indicate the positions of the substrates. Also in case of this example, up to 16 kinds of signal combinations are possible. By shaping the cam 2 as shown in FIG. 4, the signals can be generated within one plane, which is advantageous in terms of the space efficiency and the cost. In this manner, the specific addresses can be given to the substrate setting places by the kinds of the signals.

Referring to FIGS. 11-15, a method of managing the substrates will be described in detail.

Figure 11:
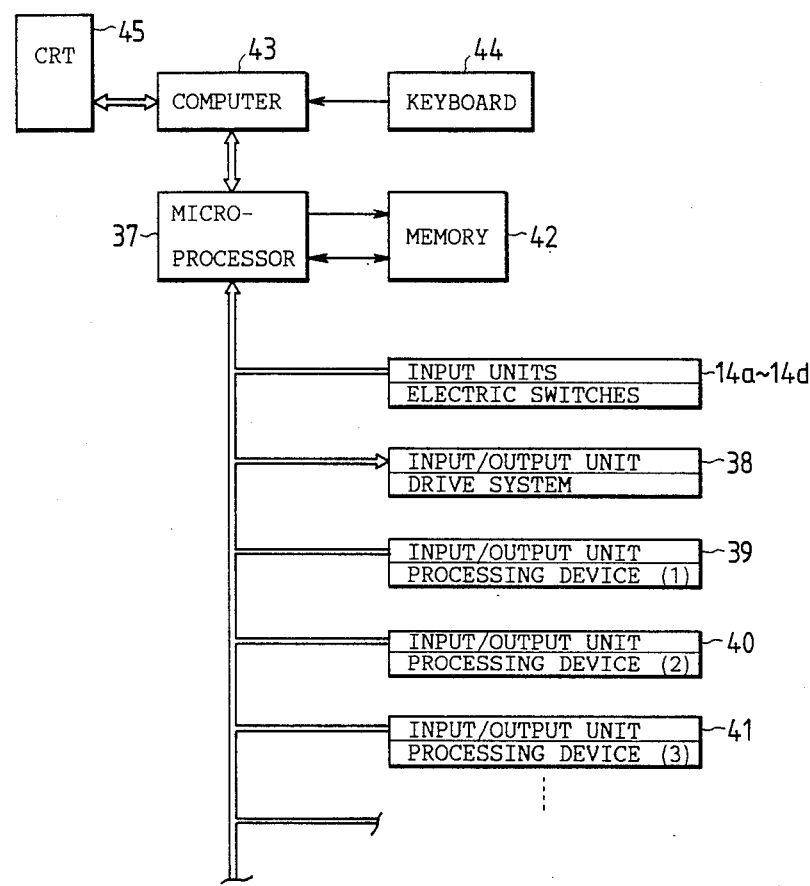

FIG. 11 is a block diagram of a system. Portions which are not directly pertinent to the present invention, for example, evacuation and utility routines are omitted from this diagram.

First, the electric switches 14a-14d for address allocation transmit digital signals to the input unit of a microprocessor 37.

The microprocessor 37 also has a bus which sends inputs and outputs through interfaces from and to a drive system 38 for rotating the setting disc 1 and several processing devices 39-41 for, e. g., crystal growth, prebaking and analytical evaluation, and it is simultaneously connected with a memory 42. As the memory 42 in this case, one which is not erased at the time of power failure is used.

The microprocessor 37 is connected with a host computer 43 including a personal computer, and the computer 43 is connected with a keyboard 44 and a CRT display unit 45.

The processing schedule of the substrates, etc. are transmitted from the keyboard 44 to the microprocessor 37 through the computer 43. The single microprocessor 37 is not restrictive, but more microprocessors may well be connected to the computer 43.

Usually, the plurality of microprocessors are directly or indirectly connected to the computer in dependence on the sizes of the respective processes.

Figure 12:
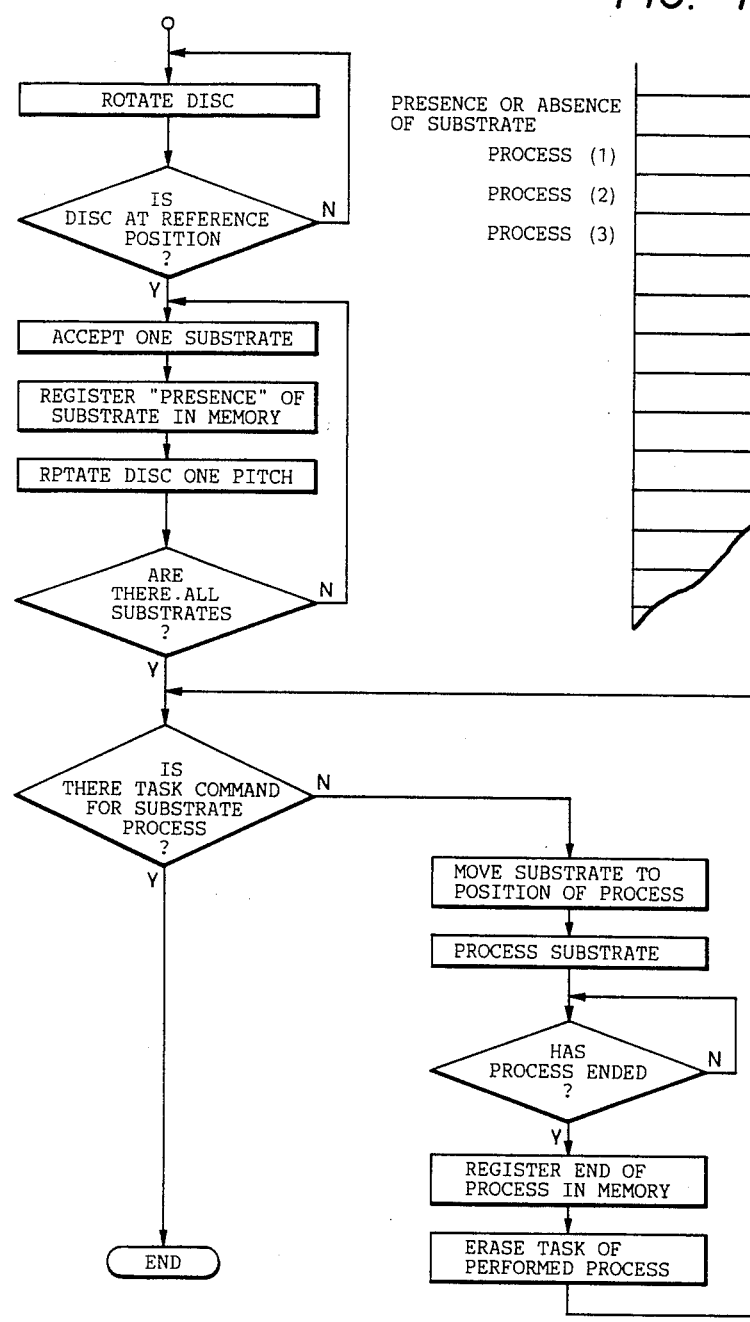

FIG. 12 shows an example of the managing method as a flow chart. A case where the processes are performed simply in series is illustrated, but another process may well be performed in parallel during one process.

Figure 13:
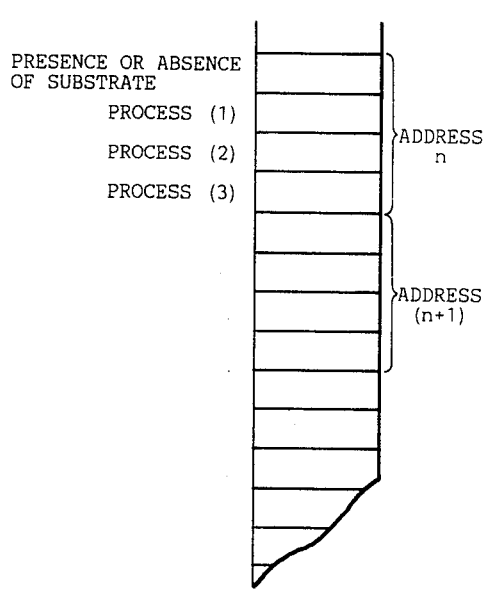

FIG. 13 shows an example of the address allocation of the memory 42, for the substrate management. An amount of memory required for substrate information is retained as a unit address.

FIG. 14 shows an example in the case where contents registered as stated above are displayed on the screen of the CRT 45. The states of distribution in which the substrates are situated at the addresses, and the end states of the processes can be displayed (mark ● indicates the presence of the substrate, or the end of the process).

FIG. 15 shows one example of application of the screen. The aspects of display are made different by receiving two signals indicative of the start of the process and the end of the process. Thus, it can also be displayed that the process is proceeding (mark o). Further, when the processing schedules have been registered, how many processes are scheduled can be displayed on the screen of the CRT 45.

Figure 16:
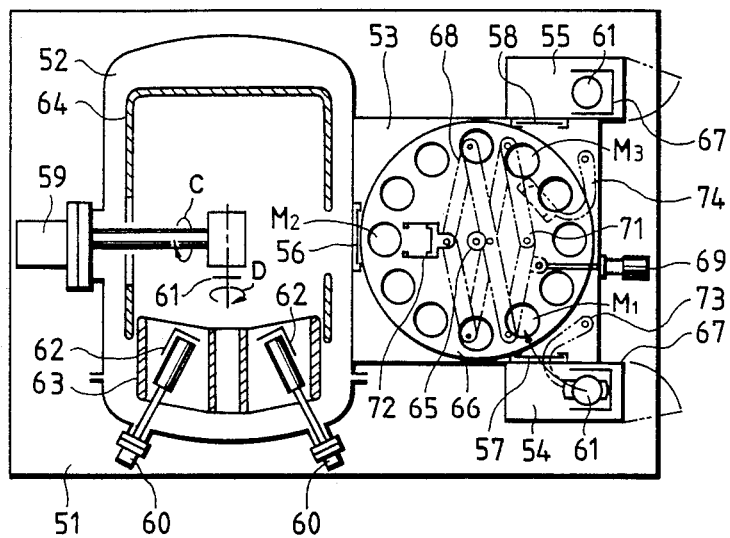

FIG. 16 is a general structural view of a molecular-beam epitaxy apparatus which is most suited to adopt the vacuum apparatus of the present invention.

A molecular-beam epitaxy growth chamber (hereinbelow, called "growth chamber") 52, a preparation chamber 53, an introduction chamber 54 and a delivery chamber 55 are arranged on a bed 51 as illustrated in the figure. Here in this example, the preparation chamber 53 is shown as being a square pillar. It is also allowed, however, to form the preparation chamber 53 into a hexagonal pillar and to arrange the growth chamber 52, introduction chamber 54 and delivery chamber 55 every second side of the hexagonal pillar. The introduction chamber 54 and the delivery chamber 55 may well be arranged inversely.

Figure 17:
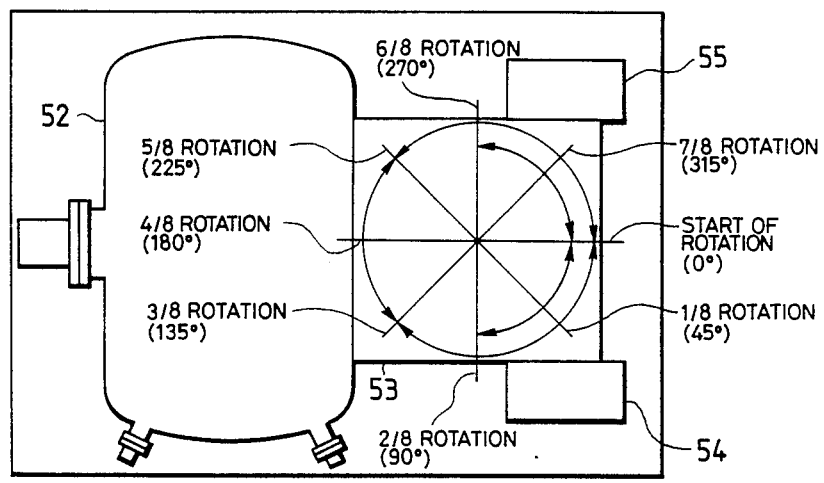
FIG. 17 is a detailed view for explaining the positional relationship of several chambers in the epitaxy apparatus.

FIG. 17 is a detailed diagram for explaining the positional relationship among the introduction chamber 54, growth chamber 52 and delivery chamber 55. The introduction chamber 54 may be located within a range of $\frac{3}{8}$ rotation (135 degrees), preferably 2/8 rotation (90 degrees) from the start of rotation (0 degree); the growth chamber 52 within a range from $\frac{3}{8}$ rotation (135 degrees) to $\frac{5}{8}$ rotation (225 degrees); and the delivery chamber 55 within a range from $\frac{5}{8}$ rotation (225 degrees), preferably 6/8 rotation (270 degrees) to the start of rotation.

The evacuation systems (not shown) of the respective chambers are arranged substantially on the bed 51.

The growth chamber 52 and the preparation chamber 53 are partitioned by a gate valve 56; the preparation chamber 53 and the introduction chamber 54 by a gate valve 57; and the preparation chamber 53 and the delivery chamber 55 by a gate valve 58. Save when a substrate 61 is shifted to another chamber, the gate valves are closed up, thereby to hold the vacua of the respective chambers independent.

The growth chamber 52 is provided with a substrate holder 59 and molecular-beam sources 60. The molecular-beam sources 60 are mounted in a number of 6–10 as one set though the number differs depending upon usage.

The substrate holder 59 is capable of revolving around the axis of the apparatus proper (as indicated by an arrow C), holding the substrate 61, and revolving around its own axis (as indicated by an arrow D) so as to rotate the substrate 61. The revolution around the axis of the apparatus proper serves to change the position of the holder 59 according to purposes such as the acceptance, molecular-beam epitaxial growth and analysis of the substrate 61, while the revolution around the own axis of the holder 59 is utilized for making the thickness of the film of the molecular-beam epitaxial growth uniform.

The molecular-beam sources 60 are respectively provided with shutters 62, and the molecular-beam epitaxial growth is controlled by opening an closing the shutters 62. The growth chamber 52 is furnished with shrouds 63 and 64 which can be filled up with liquid nitrogen, and to which molecules vaporized from the molecular-beam sources 60 are stuck so as to prevent contamination with excess molecules.

In the preparation chamber 53, a substrate setting device 66 which is pivotally mounted so as to be rotatable about a bearing 65 is disposed. This device 66 can place thereon the substrates 61 in a number close to or larger than that number of the substrates 61 which can be brought in at a time by a cassette 67. Therefore, all the substrates 61 having been thrown from within the atmospheric air into the introduction chamber 54 are transferred to the substrate setting device 66 of the preparation chamber 53 immediately after the evacuation of the introduction chamber 54, and they queue up for the molecular-beam epitaxial growth. Since the preparation chamber 53 is higher in the degree of vacuum than the introduction chamber 54, it has the effect of cleaning the substrates. Besides, the cleaning effect can be raised by an expedient such as heating.

In the preparation chamber 53, substrate pushing-up devices (not shown) are pivotally mounted in three places indicated by symbols M1–M3, and a substrate shifting mechanism 68 free to stretch and contract with a fulcrum at a pin 71 secured to the container of the preparation chamber 53 is provided. The substrate shifting mechanism 68 is stretched or contracted in such a way that a rectilinear motion is transmitted by a power introducing mechanism 69. The stretching and contracting direction of the substrate shifting mechanism 68 is restrained as predetermined by means such as guides (not shown) disposed separately. Swivel arms 73 and 74 are turnably provided in association with positions engagable with the places indicated by the symbols M1 and M3, respectively.

When the molecular-beam epitaxy apparatus among vacuum apparatuses as described above is taken as an example, the information items of the substrates coexisting on the disc include various conditions such as the presence or absence of the substrate, the completion or incompletion of the prebaking process, the completion or incompletion of the crystal growth process, and the completion or incompletion of the surface analysis process. In this regard, according to the present embodiment, the substrates can be numbered, all the information items can be managed in software fashion, and malfunctions can be prevented.

If the disc should rotate abnormally, or if power failure or the like should occur, the states of the substrates can be acknowledged by subsequently reading the addresses.

Further, in case of using the apparatus in a research laboratory or the like, the substrates and the kinds of processes can be freely selected on such an occasion that the respective substrates are subjected to the processes differing at random. Therefore, the efficiency of researches rises.

Further, a preparation mechanism of high positional accuracy can be obtained owing to the reciprocating equipment which is easy to control and has high reliability, so that the apparatus can be constructed as an unmanned automaton.

What is claimed is:

1. A vacuum apparatus comprising:
   an introduction chamber through which a plurality of substrates are respectively introduced into said vacuum apparatus;
   a delivery chamber through which said plurality of substrates are respectively removed from said vacuum apparatus;
   a plurality of processing chambers in which each of said plurality of substrates is processed according to a respective predetermined processing routine, said plurality of processing chambers producing a first plurality of signals indicative of said processing;

a preparation chamber in which said plurality of substrates are stored;

a substrate setting disk rotatably arranged in said preparation chamber and on which said plurality of substrates are placed, said substrate setting disk receiving said plurality of substrates from said introduction chamber, wherein said substrate setting disk delivers said plurality of substrates to said plurality of processing chambers for processing and to said delivery chamber for removal from said vacuum apparatus;

a drive system for driving and rotating said substrate setting disk and producing a signal indicative thereof;

a cam mechanism fixed to said substrate setting disk;

a plurality of signal generating circuits for generating a second plurality of signals in response to the rotation of said cam mechanism; and a control means for controlling the rotation of said substrate setting disk in response to said first and second plurality of signals and said signal from said drive system.

2. A vacuum apparatus according to claim 1, wherein said control means comprises:

memory means for storing status information relating to the status of said processing of said plurality of substrates by said plurality of processing chambers;

calculation means for calculating, in response to said first and second plurality of signals, said status information stored in said memory means; and display means for displaying said status information stored in said memory.

3. A vacuum apparatus according to claim 1, wherein said plurality of signal generating circuits comprise a plurality of switches each having an ON position and an OFF position.

4. A vacuum apparatus according to claim 3, wherein said cam mechanism includes a plurality of convex portions, at least one of said plurality of convex portions making contact with at least one of said plurality of switches to cause said at least one switch to change from one of the ON position to the OFF position and the OFF position to the ON position.

5. A vacuum apparatus according to claim 1, wherein at least one of said plurality of processing chambers comprises:

a growth chamber in which said plurality of substrates are respectively subjected to molecular-beam epitaxial growth.

6. A vacuum apparatus according to claim 5, wherein another of said plurality of processing chambers comprises:

a baking process chamber in which said plurality of substrates are baked prior to being subjected to said epitaxial growth.

7. A vacuum apparatus according to claim 6, further comprising:

an evacuation means for evacuating said introduction chamber, said delivery chamber and said preparation chamber.

* * * * *